(12) United States Patent
Ohtani

(10) Patent No.: US 7,199,404 B2
(45) Date of Patent: Apr. 3, 2007

(54) SEMICONDUCTOR SUBSTRATE AND SEMICONDUCTOR DEVICE USING THE SAME

(75) Inventor: Kinya Ohtani, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 49 days.

(21) Appl. No.: 10/999,229

(22) Filed: Nov. 30, 2004

(65) Prior Publication Data

US 2005/0151221 A1 Jul. 14, 2005

(30) Foreign Application Priority Data

Dec. 25, 2003 (JP) ............................. 2003-430267

(51) Int. Cl.
*H01L 31/111* (2006.01)
*H01L 29/76* (2006.01)

(52) U.S. Cl. ............... 257/142; 257/341; 257/E29.107; 257/E29.198

(58) Field of Classification Search ................ 257/142, 257/341, E29.107, E29.198
See application file for complete search history.

(56) References Cited

U.S. PATENT DOCUMENTS 4,972,239 A * 11/1990 Mihara ....................... 257/142
6,271,061 B1 * 8/2001 Frisina et al. ............... 438/138
6,384,431 B1 * 5/2002 Takahashi et al. .......... 257/147
6,774,407 B2 * 8/2004 Kushida ...................... 257/131

FOREIGN PATENT DOCUMENTS

JP 2001-7149 1/2001
WO WO 96/32749 * 10/1996

* cited by examiner

*Primary Examiner*—Long Pham
*Assistant Examiner*—Steven Rao
(74) *Attorney, Agent, or Firm*—McGinn IP Law Group, PLLC (57) ABSTRACT

A semiconductor substrate used for fabricating vertical devices, such as vertical MOSFET, capable of maintaining low ON-stage resistance and of ensuring a necessary level of OFF-stage breakdown voltage is provided. A heavily-doped arsenic layer of 0.5 to 3.0 μm thick is inserted between a heavily-doped phosphorus layer 11 composing the drain of a vertical MOSFET and an n⁻-type drift layer. The heavily-doped arsenic layer functions as a barrier layer which prevents phosphorus from diffusing from the heavily-doped phosphorus layer into the n⁻-type drift layer. This is successful in maintaining spreading of the depletion layer during OFF time of the vertical MOSFET to thereby improve the OFF-stage breakdown voltage, and in maintaining the low ON-stage resistance.

15 Claims, 5 Drawing Sheets

PRIOR ART

FIG. 8

SEMICONDUCTOR SUBSTRATE AND SEMICONDUCTOR DEVICE USING THE SAME

This application is based on Japanese patent application No. 2003-430267 the content of which is incorporated hereinto by reference.

DISCLOSURE OF THE INVENTION

1. Field of the Invention

The present invention relates to a semiconductor substrate and a semiconductor device, and in particular to a semiconductor substrate suitable for fabricating semiconductor devices having vertical devices such as vertical MOSFET, and a semiconductor device fabricated using the semiconductor substrate.

2. Related Art

Figure 7:
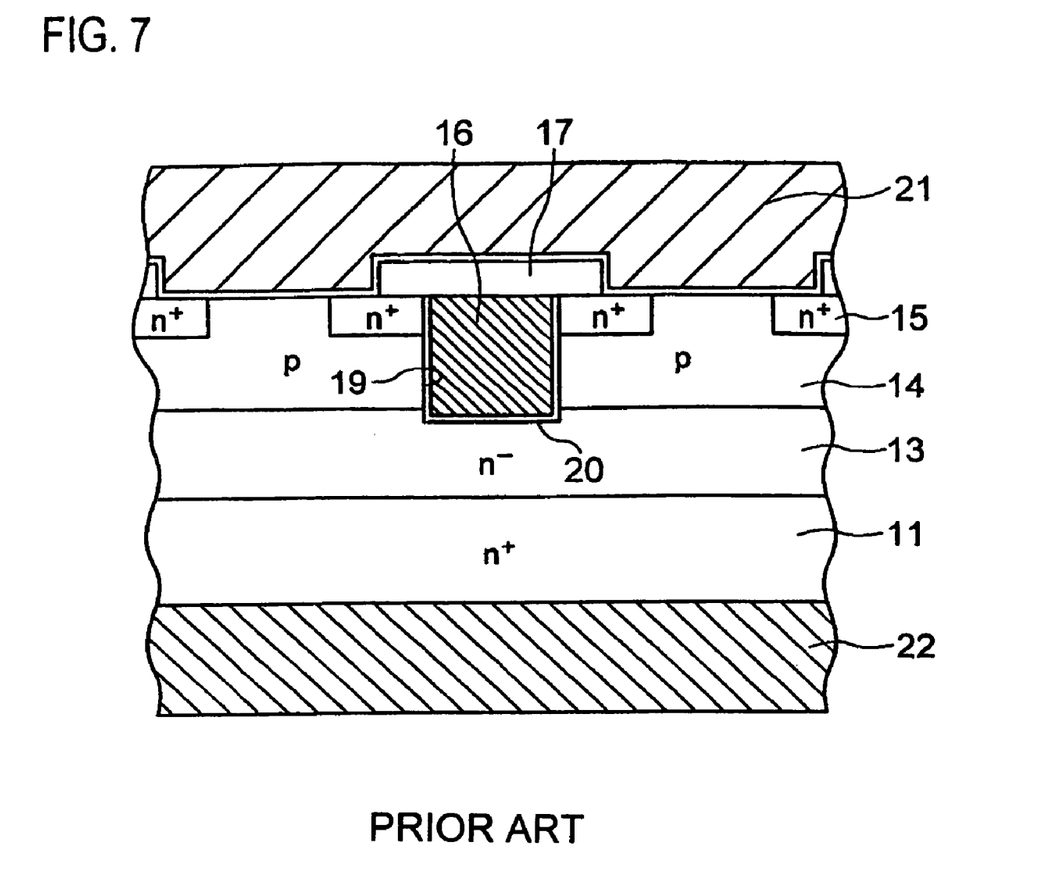
FIG. 7 is a sectional view showing a configuration of a conventional semiconductor device.

Semiconductor devices having vertical devices such as vertical MOSFET and insulated gate bipolar transistor are widely used as high-output semiconductor devices handling high voltage and large current, in the field of power electronics. FIG. 7 shows a conventional vertical semiconductor device described in Japanese Laid-Open Patent Publication No. 2001-7149. The conventional semiconductor device is formed on a semiconductor substrate having a silicon layer ($n^+$-type, heavily-doped layer) 11 heavily doped with phosphorus, and an epitaxial silicon layer ($n^-$-type drift layer) 13 formed on the $n^+$-type, heavily-doped layer 11 and lightly doped with an n-type impurity. Phosphorus or arsenic is used as the n-type impurity contained in the $n^-$-type drift layer 13.

The vertical MOSFET has a diffusion layer formed in the surficial portion of the $n^-$-type drift layer 13 of the semiconductor substrate, and the diffusion layer further comprises a p-type base layer 14 doped with a p-type impurity and an $n^+$-type source layer 15 formed in the surficial portion of the p-type base layer 14. In the vicinity of the $n^+$-type source layer 15, a gate electrode 16 is formed so as to penetrate the bottom of the p-type base layer 14 and so as to reach the $n^-$-type drift layer 13. The gate electrode 16 is isolated from the $n^+$-type source layer 15, p-type base layer 14 and $n^-$-type drift layer 13 by a silicon oxide layer 20. The $n^+$-type source layer 15 and p-type base layer 14 are connected to an upper electrode 21 formed on the substrate, and the $n^+$-type, heavily-doped layer 11 composing the drain is connected to a lower electrode 22 formed on the back of the substrate.

In the vertical MOSFET, a channel is formed in the p-type base layer 14 along the gate electrode 16 and thereby ON current flows between both electrodes 21, 22 when source voltage is applied between the upper electrode 21 and lower electrode 22, and a positive voltage is applied to the gate electrode 16. When the gate electrode 16 is not applied with a positive voltage, insulation between the source and drain is maintained because the p-n junction at the interface between the p-type base layer 14 and $n^-$-type drift layer 13 is applied with a reverse bias due to the applied voltage between the upper electrode 21 and lower electrode 22, and a depletion layer is formed in the vicinity of the p-n junction.

In the vertical MOSFET, a heavily-doped phosphorus layer having a specific resistance typically as low as several tens of microohms·cm or below is used as the $n^+$-type, heavily-doped layer 11, for the purpose of allowing a large current to flow. Phosphorus, which is a doped impurity, may diffuse upwardly into the $n^-$-type drift layer 13 due to annealing carried out in every stage of fabrication process of the semiconductor device. Phosphorus diffused into the $n^-$-type drift layer 13 may prevent the depletion layer of MOSFET in a product form from fully spreading in the OFF state, and thereby may fail in ensuring a desirable level of OFF-stage breakdown voltage necessary for the device. One possible way of ensuring a desirable level of OFF-stage breakdown voltage may be increase in the thickness of the drift layer 13 so as to allow the depletion layer to fully spread. This may, however, result in a longer current flow path in a portion having a large specific resistance, and may increase the ON-stage resistance of the vertical device.

Figure 8:
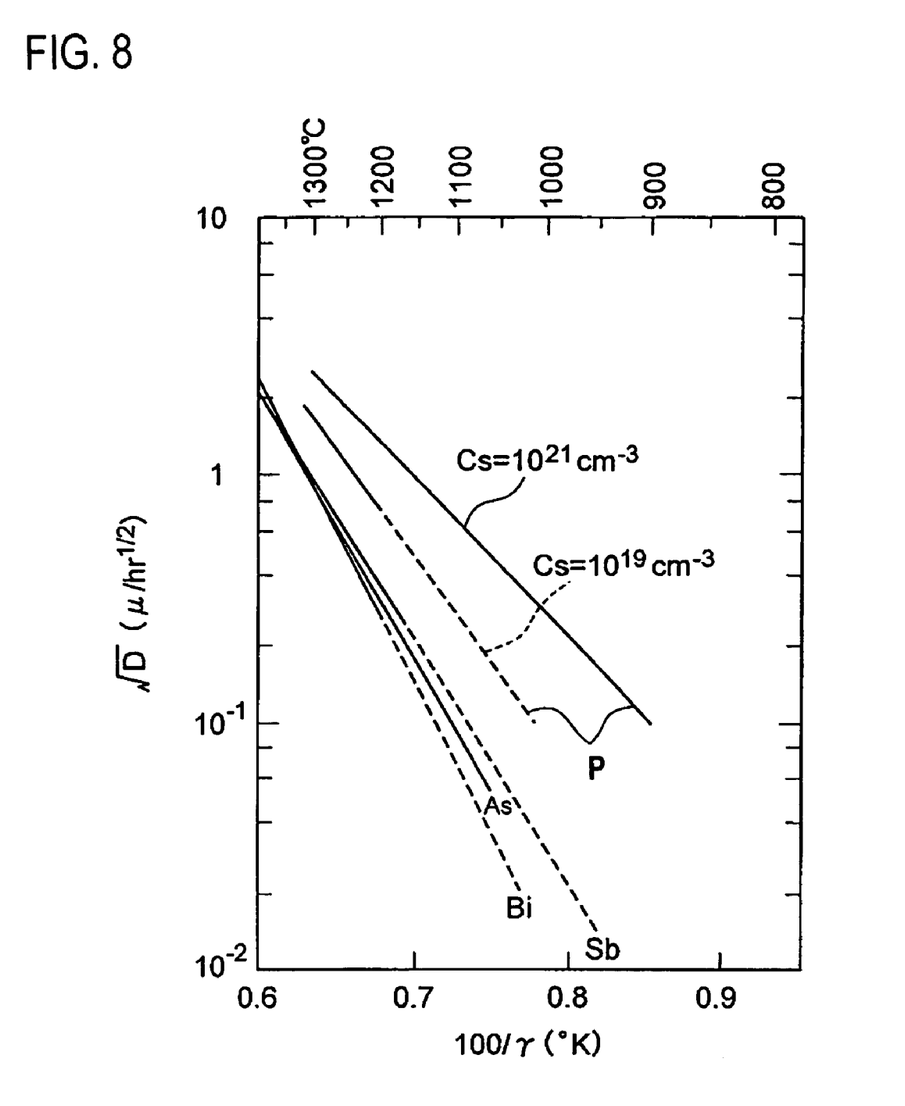
FIG. 8 is a graph showing diffusion coefficient of donors in silicon at various temperatures.

Use of arsenic in place of phosphorus, as an impurity of the $n^+$-type, heavily-doped layer 11, will be successful in suppressing the impurity diffusion from the $n^+$-type, heavily-doped layer 11 during annealing of the semiconductor device, because arsenic is considerably small in diffusion coefficient as compared with phosphorus as shown in FIG. 8. This is advantageous in ensuring a necessary level of OFF-stage breakdown voltage because the depletion layer can fully be formed during the OFF state. Arsenic is, however, low in solid solubility to silicon as compared with phosphorus, so that even a maximum level of arsenic doping only results in an $n^+$-type, heavily-doped layer having a specific resistance larger by ten times or more than the specific resistance of the $n^+$-type, heavily-doped layer 11 doped with phosphorus. Because use of arsenic for the $n^+$-type, heavily-doped layer 11 excessively raises the ON-stage resistance of MOSFET, phosphorus has generally been used as a dopant for the $n^+$-type, heavily-doped layer as described in the above.

In pursuit of higher output of the vertical device, it is indispensable to make use of still higher voltage and larger current, and this demands a new technique of lowering the ON-stage resistance as possible while keeping a necessary level of OFF-stage breakdown voltage.

SUMMARY OF THE INVENTION

According to the present invention, there is provided a semiconductor substrate comprises a first silicon layer containing phosphorus as an impurity with a first concentration, and a second silicon layer formed on the first silicon layer and containing an n-type impurity with a second concentration lower than the first concentration, and further comprises a third silicon layer containing an n-type impurity with a third concentration, as being disposed between the first silicon layer and the second silicon layer so as to prevent phosphorus contained in the first silicon layer from diffusing into the second silicon layer.

According to the present invention, there is provided a semiconductor device having a transistor formed on the above-described semiconductor substrate of the present invention.

In the semiconductor substrate of the present invention, the third silicon layer can prevent the impurity phosphorus contained in the first silicon layer from diffusing into the second silicon layer during annealing carried out in every stage of fabrication process of the semiconductor device, so that the second silicon layer of the resultant semiconductor device is suppressed in increase in the impurity concentration. This is successful in ensuring a sufficient level of OFF-stage breakdown voltage of the vertical devices in a final product form, such as vertical MOSFET and insulated gate bipolar transistor. It is, therefore, no more necessary to increase the thickness of the second silicon layer in order to ensure a desirable level of OFF-stage breakdown voltage, and to increase the ON-stage resistance.

As a consequence in the fabrication of semiconductor devices having vertical devices such as vertical MOSFET and insulated gate bipolar transistor, the present invention makes it possible to provide a semiconductor substrate capable of realizing a sufficiently high OFF-stage breakdown voltage and a sufficiently low ON-stage resistance at the same time, and to provide also a semiconductor device fabricated by using such semiconductor substrate.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The semiconductor substrate of the present invention may be configured so that the n-type impurity contained in the third silicon layer has a diffusion coefficient to silicon smaller than that of phosphorus, and so that the third concentration is lower than the first concentration and higher than the second concentration. This makes it possible to more reliably suppress the diffusion of impurity phosphorus contained in the first silicon layer into the second silicon layer. This case successfully results in a semiconductor substrate having a concentration distribution particularly suitable for fabrication of the vertical devices. The n-type impurity can be exemplified by arsenic (As) and antimony (Sb).

In the present invention, the specific resistance of the first silicon layer and third silicon layer may be 0.1 Ω·cm or less. This makes it possible, for example, to furthermore reliably obtain a MOSFET having a sufficiently low OFF resistance when the substrate is used for fabrication of the vertical devices. It is to be understood that there are no specific limitations on the lower limits of the specific resistance of the first silicon layer and third silicon layer, and the specific resistance may be set to any value depending on the concentration design.

In the present invention, the thickness of the third silicon layer may fall in a range from 0.5 μm to 3 μm, both ends inclusive. The thickness of the third silicon layer adjusted to 0.5 μm or more is successful in further effectively preventing the phosphorus diffusion. The thickness thereof adjusted to 3 μm or less is successful in further reliably obtaining a sufficiently low ON-stage resistance of the resultant vertical device.

Transistors that can most effectively express the effects of the semiconductor substrate of the present invention are vertical devices such as vertical MOSFET and insulated gate bipolar transistor. This is because the semiconductor substrate of the present invention is successful in obtaining a low ON-stage resistance between the top surface side and the back surface side of the substrate, and because variation in the impurity concentration due to the phosphorus diffusion is suppressed, and thereby a necessary level of OFF-stage breakdown voltage between the top surface side and the back surface side of the substrate can be ensured.

Figure 1:
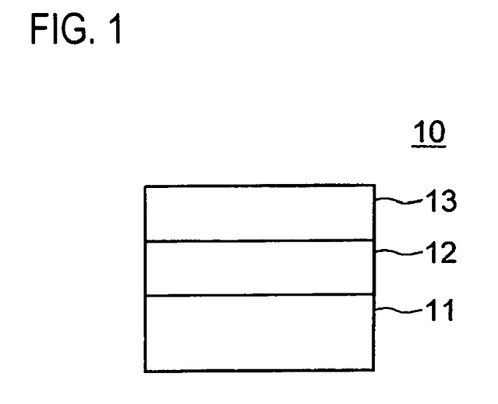
FIG. 1 is a sectional view showing a configuration of a semiconductor substrate according to a first embodiment of the present invention.

Next paragraphs will further detail the present invention based on embodiments of the present invention, referring to the attached drawings. FIG. 1 is a sectional view of a semiconductor substrate (silicon substrate) 10 according to one embodiment of the present invention. The semiconductor substrate 10 comprises a heavily-doped phosphorus layer 11 composed of silicon heavily doped with impurity phosphorus, a heavily-doped arsenic layer 12 formed thereon and composed of silicon heavily doped with impurity arsenic, and an n⁻-type drift layer 13 composed of silicon lightly doped with impurity phosphorus or arsenic, in this order as viewed from the lower side. The heavily-doped arsenic layer 12 functions as a diffusion preventive layer (barrier layer) preventing the impurity phosphorus contained in the heavily-doped phosphorus layer 11 from diffusing into the n⁻-type drift layer 13.

As for impurity concentration of the individual layers, phosphorus concentration of the heavily-doped phosphorus layer 11 is typically adjusted to 2.7E17 atoms/cm³ or more, arsenic concentration of the heavily-doped arsenic layer 12 is adjusted to 9E16 atoms/cm³ or more, and phosphorus concentration of the n⁻-type drift layer 13 is adjusted to less than 9E16 atoms/cm³. This makes it possible to further reliably lower the ON-stage resistance between the top surface side and back surface side of the semiconductor substrate 10, and to further stably ensure the OFF-stage breakdown voltage.

As for thickness of the individual layers, the heavily-doped phosphorus layer 11 is typically adjusted to 200 μm, the heavily-doped arsenic layer 12 is adjusted to a range from 0.5 to 3 μm, typically 1 μm, and the n⁻-type drift layer 13 is adjusted to 5 to 6 μm or around. This makes it possible to further reliably suppress the phosphorus diffusion, and to further reliably lower the ON-stage resistance while successfully thinning the n⁻-type drift layer 13.

As for specific resistance of the individual layers, the heavily-doped phosphorus layer 11 is adjusted to several tens of milliohms (typically 50 to 60 mΩ)·cm, the heavily-doped arsenic layer is adjusted to 0.1 Ω·cm, the n⁻-type drift layer 13 is several tenth of ohms (typically 0.5 to 0.6 Ω)·cm to several tens of ohms (typically 50 to 60 Ω)·cm or around. This makes it possible to further reliably lower the ON-stage resistance between the top surface side and back surface side of the semiconductor substrate 10, and to further stably ensure the OFF-stage breakdown voltage.

FIG. 1 herein showed a configuration in which the heavily-doped arsenic layer 12 was provided as a layer which functions as the diffusion preventive layer (barrier layer), it is also allowable to dispose a layer containing an n-type impurity having a diffusion coefficient to silicon smaller than that of phosphorus, in place of the barrier layer containing impurity arsenic. This is successful in more effectively suppressing the phosphorus diffusion. This sort of n-type impurity can be exemplified by an element having a diffusion coefficient smaller than that of phosphorus shown in FIG. 8. More specifically, antimony is available.

The semiconductor substrate 10 of the present embodiment can be fabricated by obtaining a silicon substrate heavily doped with impurity phosphorus, and by sequentially forming, on the silicon substrate, the silicon layer heavily doped with impurity arsenic, and the silicon layer lightly doped with impurity arsenic or phosphorus by the epitaxial growth method. Alternatively, it is also allowable to separately obtain a silicon substrate heavily doped with impurity phosphorus, and a silicon substrate having a silicon layer heavily doped with impurity arsenic and a silicon layer lightly doped with impurity arsenic, and to bond both silicon substrates with each other. It is still also allowable to grow an undoped silicon layer (i-silicon layer) on the substrate heavily doped with impurity phosphorus, and ion implantation is carried out to the i-silicon layer to thereby form the heavily-doped arsenic layer 12 and $n^-$-type drift layer 13. The substrate heavily doped with phosphorus can be fabricated typically by introducing phosphorus during withdraw process of a silicon crystal ingot.

Impurity concentrations of the heavily-doped phosphorus layer 11 and heavily-doped arsenic layer 12 are set to concentration values close to the individual upper limits of the solid solubility of phosphorus and arsenic to silicon. This is particularly effective in preventing phosphorus contained in the heavily-doped phosphorus layer 11 from diffusing into the drift layer during annealing in the fabrication process of the semiconductor device because of arsenic contained almost to as much as the solid solubility limit in the heavily-doped arsenic layer 12. In other words, this sort of heavily-doped arsenic layer 12 is particularly excellent in function as a barrier layer capable of preventing the phosphorus diffusion.

Figure 2:
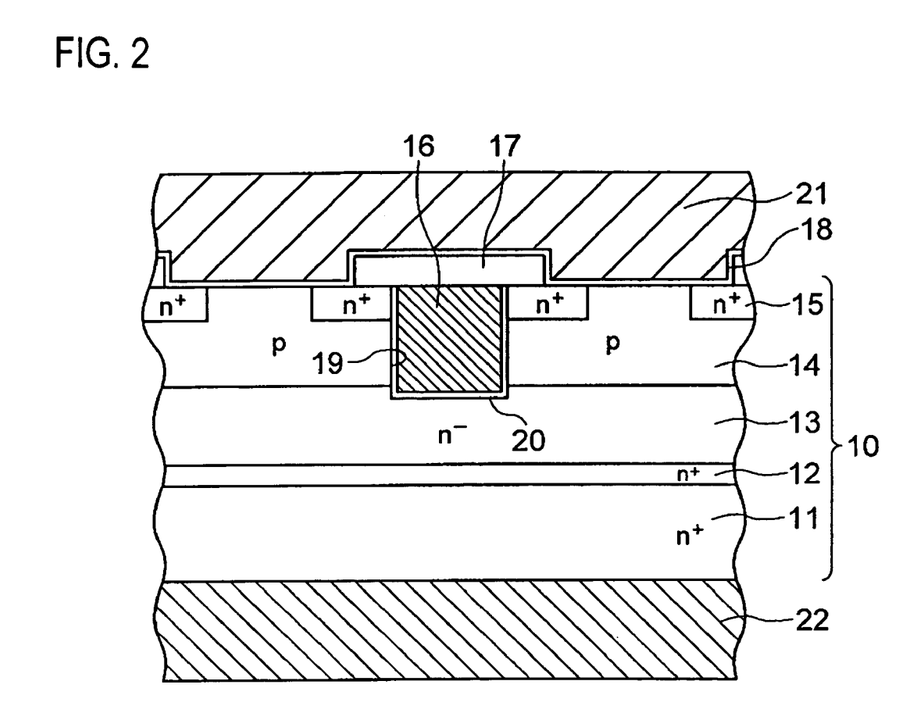
FIG. 2 is a sectional view showing the configuration of a semiconductor device according to the first embodiment of the present invention.
Figure 3:
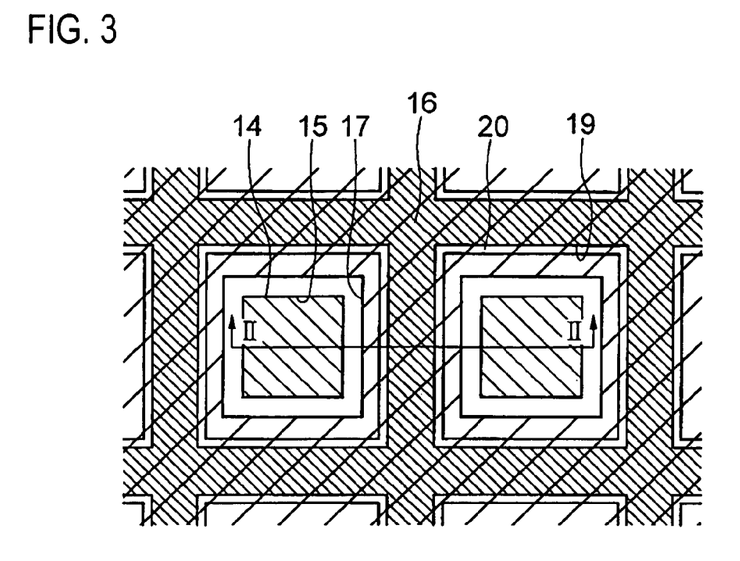
FIG. 3 is a plan view showing the configuration of a semiconductor device according to the first embodiment of the present invention.

FIG. 2 and FIG. 3 are sectional view and plan view, respectively, of the semiconductor device according to the first embodiment of the present invention, fabricated using the semiconductor substrate shown in FIG. 1. It is to be noted that the upper electrode 21 is not shown in FIG. 3, and FIG. 2 shows a sectional view taken along line II—II in FIG. 3. The semiconductor device of the present embodiment is configured as a semiconductor device having a vertical MOSFET, and, as shown in FIG. 2, has diffusion layers formed in the $n^-$-type drift layer 13 of the semiconductor substrate 10 which comprises the heavily-doped phosphorus layer 11, the heavily-doped arsenic layer 12 and the $n^-$-type drift layer 13.

In more detail, the vertical MOSFET has the p-type base layer 14 of approximately 1 μm thick formed in the surficial portion of the $n^-$-type drift layer 13 by ion implantation of a p-type impurity, gate electrode 16 of approximately 1 μm deep formed in the p-type base layer 14 so as to reach the $n^-$-type drift layer 13, and the $n^+$-type source layer 15 of approximately 0.5 μm thick formed in the surficial portion of the p-type base layer 14 along the gate electrode 16. The gate electrode 16 is formed in a trench 19 having a lattice pattern as shown in FIG. 3, and each of the individual square portions partitioned by the lattice-patterned trench has the $n^+$-type source layer 15 formed therein along the gate electrode 16.

The gate electrode 16 is insulated from the $n^+$-type source layer 15, $n^-$-type drift layer 13 and p-type base layer 14 by the silicon oxide layer 20, and the $n^+$-type source layer 15 and p-type base layer 14 are connected to the upper electrode 21 of approximately 4.5 μm thick formed on the substrate. The heavily-doped phosphorus layer 11 is connected to the lower electrode 22 formed on the back surface of the substrate 10. An interlayer insulating film 17 insulates the upper electrode 21 and the gate electrode 16, and the upper electrode 21 is connected with the $n^+$-type source layer 15 and with the p-type base layer 14 while placing a barrier film 18 of approximately 130 nm thick in between. The gate electrode 16 is formed in the trench 19, and is insulated from the $n^-$-type drift layer 13, p-type base layer 14 and $n^+$-type source layer 15 by an insulating film 20 formed on the inner surface of the trench 19.

Fabrication process of the semiconductor device will be explained below, referring to FIG. 2. First, the lattice-patterned trench 19 having a depth of 1 μm and a width of band-formed strip of 0.5 μm or around is formed in the surficial portion of the $n^-$-type drift layer 13 of the semiconductor substrate 10, by photolithography and an etching process. Next, the silicon oxide layer 20 of 50 nm thick is formed by thermal oxidation process, over the surface of silicon including the inner surface of the trench 19. A polysilicon film is then deposited over the entire surface, and phosphorus is diffused therein so as to lower the resistance of the polysilicon film. Portions of the polysilicon film and oxide film formed on the top surface of the substrate 10 are then removed by the CMP process so as to leave the polysilicon film only in the trench 19, to thereby form the lattice-patterned gate electrode 16. Next, through a photoresist mask, boron is ion-implanted into the square portions partitioned by the lattice, under conditions of a dose of 2E13 atoms/cm$^3$ and an acceleration energy of 70 keV, which is followed by annealing at 1140° C. for 10 minutes so as to form the p-type base layer 14.

Next using a photoresist mask, arsenic is ion-implanted under conditions of a dose of 1E16 atoms/cm$^3$ and acceleration energy of 70 keV, which is followed by annealing at 1000° C. for 30 minutes so as to form the $n^+$-type source layer 15. Next, a silicon oxide layer is formed by the CVD process, the silicon oxide layer is then patterned by photolithography and etching so as to leave it as a lattice-patterned silicon oxide layer covering the gate electrode 16 and the circumference thereof, to thereby form the interlayer insulating film 17. In the succeeding step, the barrier film 18 composed of a Ti/TiN film is formed by sputtering, lamp-annealed, and an AlSiCu film is formed thereon by sputtering so as to form the upper electrode 21. On the back surface of the substrate 10, the lower electrode 22 is formed again by sputtering, annealed at 450° C. for 30 minutes so as to alloy the upper electrode 21 and lower electrode 22, to thereby obtain the structure shown in FIG. 2 and FIG. 3. After going through the succeeding wire bonding and so forth, a product of the semiconductor device can be obtained.

Figure 4:
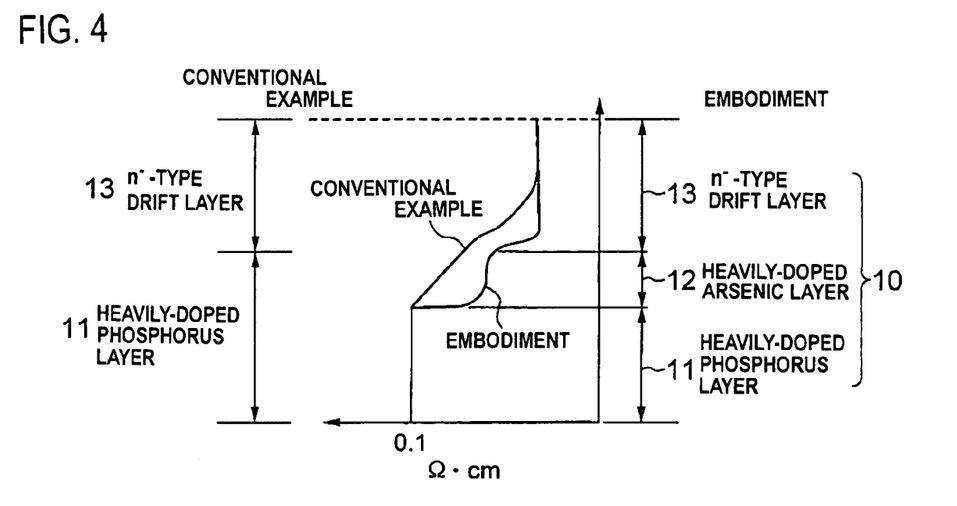
FIG. 4 is a profile chart showing impurity distributions of semiconductor devices of the first embodiment of the present invention and of a conventional example.

FIG. 4 shows an impurity concentration distribution of the substrate portion of the semiconductor device of the first embodiment fabricated using the semiconductor substrate 10, in comparison with an impurity concentration distribution of the substrate portion of a semiconductor device fabricated using a conventional semiconductor substrate.

It is found that the conventional semiconductor device shows a gently-sloping curve of the impurity concentration distribution, due to diffusion of phosphorus contained in the heavily-doped phosphorus layer 11 into the n⁻-type drift layer 13. Whereas in the semiconductor device of the present embodiment, the impurity concentration distributions of the heavily-doped phosphorus layer 11, heavily-doped arsenic layer 12, and n⁻-type drift layer 13 are found to be kept at levels almost equivalent to those immediately after fabrication of the semiconductor substrate 10. This is because the heavily-doped arsenic layer 12 successfully functioned as a barrier layer against the phosphorus diffusion during annealing in the fabrication process of the semiconductor device.

In the vertical MOSFET, which is the semiconductor device of the present embodiment, the heavily-doped arsenic layer 12 is disposed as a barrier layer blocking the phosphorus diffusion as described in the above so as to prevent impurity phosphorus contained in the heavily-doped phosphorus layer 11 from diffusing into the n⁻-type drift layer 13, so that the depletion layer can be formed during OFF time of the MOSFET, in the vicinity of the p-n junction with a sufficient degree of spreading. This makes it no more necessary to increase the thickness of the n⁻-type drift layer 13 in view of ensuring a sufficient size of the depletion layer, wherein only a small thickness of the n⁻-type drift layer 13 will suffice. This is successful in obtaining a low ON-stage resistance while keeping a desirable level of OFF-stage breakdown voltage.

Figure 5:
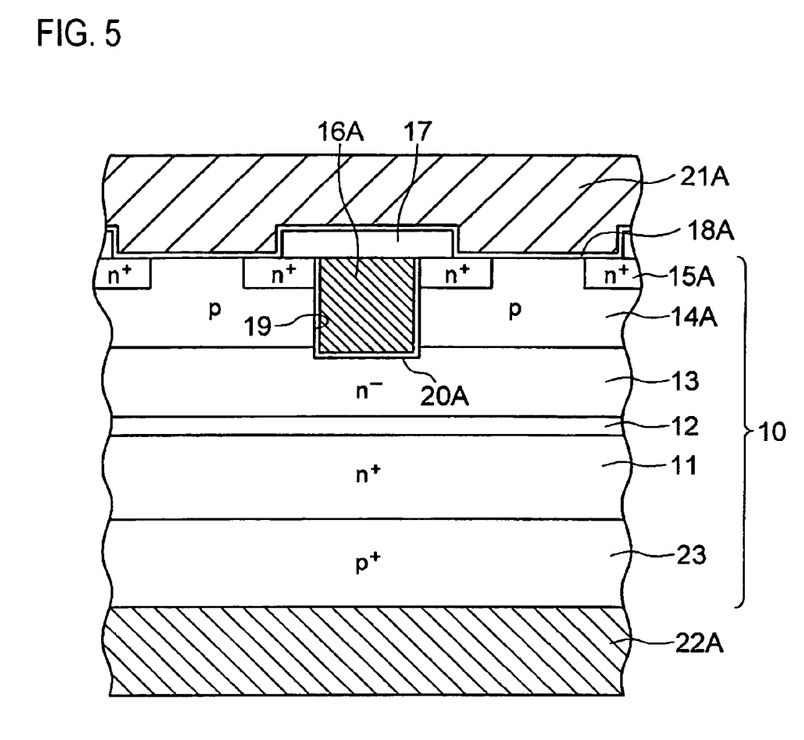
FIG. 5 is a sectional view showing a configuration of a semiconductor device of a second embodiment of the present invention.

FIG. 5 shows a sectional view of a semiconductor device according to a second embodiment of the present invention. The semiconductor device of the present embodiment is configured as an insulated gate bipolar transistor (IGBT). In a structural point of view, the IGBT further comprises a p⁺-type collector layer inserted between the heavily-doped phosphorus layer 11 and lower electrode 22 in the vertical MOSFET shown in FIG. 2. The IGBT has an n⁺-type, heavily-doped layer 15A, a p-type emitter layer 14A, the n⁻-type drift layer 13, the heavily-doped arsenic layer 12 and the heavily-doped phosphorus layer 11, and further comprises a base layer connected to a base electrode 16A, and a p⁺-type collector layer 23, wherein all of these are placed between the upper electrode 21A which composes an emitter electrode and a lower electrode 22A which composes a collector electrode. It is also allowable that the semiconductor substrate having the p-type collector layer 23 can be formed typically by bonding the substrate 10 shown in FIG. 1 and a separate substrate heavily doped with boron or the like.

Similarly to as in the semiconductor device of the first embodiment, the heavily-doped arsenic layer 12 also in the semiconductor device of the present embodiment can function as a barrier layer against the phosphorus diffusion, so that only a small thickness of n⁻-type drift layer 13 can allow the depletion layer to fully spread during OFF time of the transistor, and thereby a necessary level of OFF-stage breakdown voltage can be obtained.

Figure 6:
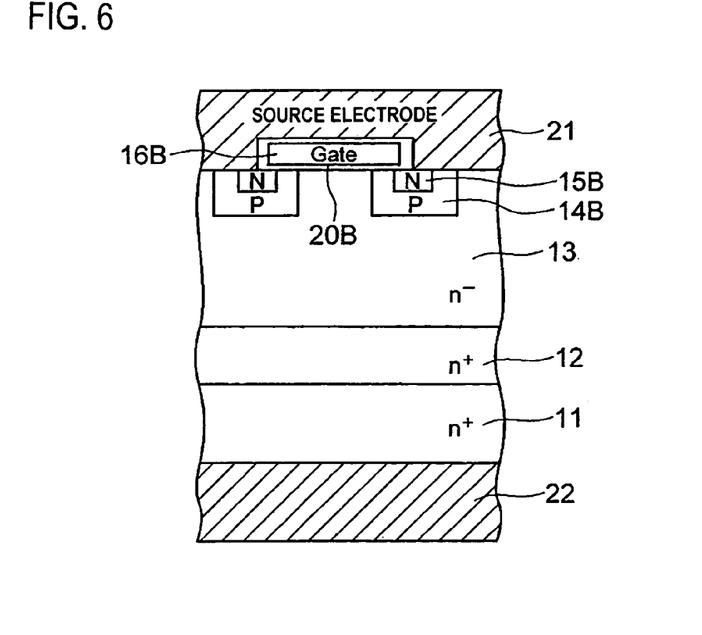
FIG. 6 is a sectional view showing a configuration of a semiconductor device of a third embodiment of the present invention.

FIG. 6 shows a semiconductor device of a third embodiment of the present invention. The semiconductor device of the present embodiment differs from the semiconductor device of the first embodiment in the geometry of the gate electrode and p-type base layer of the vertical MOSFET. In the present embodiment, p-type base layers 14B are disposed in the surficial portion of the n⁻-type drift layer 13 as being corresponded to the edges of the individual band-formed strips of the lattice-patterned gate electrode 16B, and each of the p-type base layers 14B has a single n⁺-type source layer 15B formed in the surficial portion thereof. The gate electrode 16B is disposed over both n⁺-type source layers 15B and p-type base layers 14B while placing a gate insulating film 20B in between. Other configurations are same as those in the semiconductor device of the first embodiment.

Similarly to as in the semiconductor device of the first embodiment, the heavily-doped arsenic layer 12 can function as a barrier layer against the phosphorus diffusion also in the semiconductor device of the present embodiment, so that the depletion layer can fully spread even in the n⁻-type drift layer 13 having only a small thickness during OFF time of the vertical MOSFET, and thereby a necessary level of OFF-stage breakdown voltage can be obtained. It is to be noted that any embodiments can adopt a heavily-doped antimony layer in place of the heavily-doped arsenic layer 12.

The semiconductor devices of the above embodiments are preferably applicable to the field of power electronics and the like, and is particularly suitable, for example, for protective circuit preventing over-charging or over-discharging of secondary batteries.

The foregoing paragraphs have described the present invention referring to the preferred embodiments. The semiconductor substrate and semiconductor device of the present invention are, however, by no means limited to those having the configurations of these embodiments, and any modifications and alterations of the configurations of the embodiments are also included within a scope and spirit of the present invention.

What is claimed is:

1. A semiconductor substrate comprising:
   a first silicon layer containing phosphorus as an impurity with a first concentration;
   a second silicon layer formed on said first silicon layer and containing an n-type impurity with a second concentration lower than said first concentration; and
   a third silicon layer containing an n-type impurity with a third concentration, being disposed between said first silicon layer and said second silicon layer so as to prevent phosphorus contained in said first silicon layer from diffusing into said second silicon layer.

2. The semiconductor substrate according to claim 1, wherein said n-type impurity contained in said third silicon layer has a diffusion coefficient to silicon lower than that of phosphorus, and said third concentration is lower than said first concentration and higher than said second concentration.

3. The semiconductor substrate according to claim 2, wherein said n-type impurity contained in said third silicon layer is arsenic or antimony.

4. The semiconductor substrate according to claim 3, wherein said first silicon layer and said third silicon layer have a specific resistance of 0.1 Ω-cm or less.

5. The semiconductor substrate according to claim 1, wherein thickness of said third silicon layer falls in a range from 0.5 µm to 3 µm.

6. A semiconductor device having a transistor formed on said semiconductor substrate described in claim 1.

7. The semiconductor device according to claim 6, wherein said transistor comprises a vertical MOSFET or an insulated gate bipolar transistor.

8. The semiconductor substrate according to claim 6, wherein said transistor comprises a vertical transistor.

9. The semiconductor substrate according to claim 1, wherein said third silicon layer is disposed between said first silicon layer and said second silicon layer so as to prevent said phosphorus contained in said first silicon layer from diffusing into said second layer during manufacture.

10. The semiconductor substrate according to claim 9, wherein said third silicon layer is disposed between said first silicon layer and said second silicon layer so as to prevent said phosphorus contained in said first silicon layer from diffusing into said second layer during annealing.

11. A vertical MOSFET, comprising:
- a first silicon layer containing a first impurity of a first conductivity in a first concentration and said first impurity having a first diffusion coefficient;
- a second silicon layer containing a second impurity of said first conductivity in a second concentration lower than said first concentration;
- a third silicon layer containing a third impurity of said first conductivity having a diffusion coefficient to silicon lower than that of said first impurity in a third concentration between said first concentration and said second concentration, and disposed between said first silicon layer and said second silicon layer so as to prevent said first impurity contained in said first silicon layer from diffusing into said second silicon layer; and
- a fourth silicon layer containing a fourth impurity of a second conductivity formed on said second silicon layer as a base layer.

12. The vertical MOSFET according to claim 11, wherein said third impurity is selected from the group consisting of arsenic and antimony.

13. The vertical MOSFET according to claim 11, wherein said first impurity and said second impurity comprise the same impurity.

14. The vertical MOSFET according to claim 11, wherein said third silicon layer has a thickness t such that $0.5\ \mu m \leq t \leq 3.0\ \mu m$.

15. The vertical MOSFET according to claim 11, further comprising a gate electrode formed in said fourth silicon layer to reach said second silicon layer.

* * * * *